(12) United States Patent
Elder-Groebe et al.

(10) Patent No.: US 9,696,403 B1
(45) Date of Patent: Jul. 4, 2017

(54) REPLACEABLE INTERNAL OPEN-SHORT-LOAD (OSL) CALIBRATOR AND POWER MONITOR

(75) Inventors: George Elder-Groebe, Los Gatos, CA (US); Eiji Mori, San Jose, CA (US); Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 1294 days.

(21) Appl. No.: 13/529,288

(22) Filed: Jun. 21, 2012

(51) Int. Cl.
*G01R 35/00* (2006.01)
*G01R 23/163* (2006.01)
*G01R 27/28* (2006.01)
*G01R 27/32* (2006.01)

(52) U.S. Cl.
CPC .......... *G01R 35/005* (2013.01); *G01R 23/163* (2013.01); *G01R 27/28* (2013.01); *G01R 27/32* (2013.01)

(58) Field of Classification Search
CPC .................................................. G01R 35/005
See application file for complete search history.

(56) References Cited

U.S. PATENT DOCUMENTS

| | | | |
|---|---|---|---|
| 5,548,538 A | 8/1996 | Grace et al. | |
| 5,715,183 A | 2/1998 | Grace et al. | |
| 6,614,237 B2 | 9/2003 | Ademian et al. | |
| 6,965,241 B1* | 11/2005 | Liu | G01R 27/28 324/601 |
| 7,254,511 B2* | 8/2007 | Niedzwiecki | G01R 27/04 324/601 |
| 2008/0265911 A1* | 10/2008 | Breakenridge | G01R 21/01 324/638 |
| 2012/0185199 A1* | 7/2012 | Moran | G01R 35/005 702/107 |
| 2013/0082687 A1* | 4/2013 | Chizevsky | G01R 35/005 324/120 |

* cited by examiner

*Primary Examiner* — Alexander Satanovsky
*Assistant Examiner* — John Kuan
(74) *Attorney, Agent, or Firm* — Tucker Ellis LLP

(57) ABSTRACT

Systems and methods are provided for a replaceable internal open-short-load (OSL) calibrator and power monitor. A calibration system can include a test port; and a replaceable module including a first lookup table corresponding to an open-short-load (OSL) component and a second lookup table corresponding to a power measuring component.

8 Claims, 5 Drawing Sheets

REPLACEABLE INTERNAL OPEN-SHORT-LOAD (OSL) CALIBRATOR AND POWER MONITOR

BACKGROUND

Technical Field

The present invention relates to power measurement devices and in particular to a replaceable internal open-short-load (OSL) calibrator and power monitor.

Related Art

Existing calibration components currently in use are typically high precision, one piece Open-Short-Load (OSL) or single connection calibration components (such as Instacal). The calibration component typically includes a non-precision switch selectable OSL. A high precision table representing the actual values of these standards is stored in the Instacal module and read out to a vector network analyzer (VNA) to correct for errors in the calibration component and the measuring reflectometer errors. The end result is a precision calibrated test port. Power measurements are typically performed with either a dedicated precision power sensor that plugs into the VNA, enabling the DC voltage out of the detector to be converted into digital readings for display, or a USB controlled complete power sensor plugged into the VNA for display.

SUMMARY

Systems and methods are provided for a replaceable internal open-short-load (OSL) calibrator and power monitor. A calibration system can include a test port; and a replaceable module including a first lookup table corresponding to an open-short-load (OSL) component and a second lookup table corresponding to a power measuring component.

BRIEF DESCRIPTION OF THE DRAWINGS

Further details of the present invention are explained with the help of the attached drawings in which.

DETAILED DESCRIPTION

In accordance with an embodiment, systems and methods are provided for a replaceable internal open-short-load (OSL) calibrator and power monitor. A calibration system can include a test port; and a replaceable module including a first lookup table corresponding to an open-short-load (OSL) component and a second lookup table corresponding to a power measuring component.

In accordance with an embodiment, an Open-Short-Load (OSL) is incorporated with a power meter using the same test connector. The module can include high precision tables for the OSL, representing the actual values of the OSL, as well as temperature/power/frequency lookup tables for the power meter. These tables can be stored in memory on-board the module. The data stored in each table can be used to determine a more precise calibration or power measurement based on the measured characteristics.

The OSL, power meter, and associated tables can be stored in a single replaceable module mounted along one side of a handheld, portable measurement device. Factory stored values of the tables can be stored in non-volatile memory. Thus, by making the module, replaceable and easily accessible, if a user accidentally damages the module, for example by putting too much power into it, a replacement module can be easily fitted. Since the calibration factors are stored in the module, the measurement device does not require recalibration after installing the replacement module, reducing downtime for the user.

Figure 1:
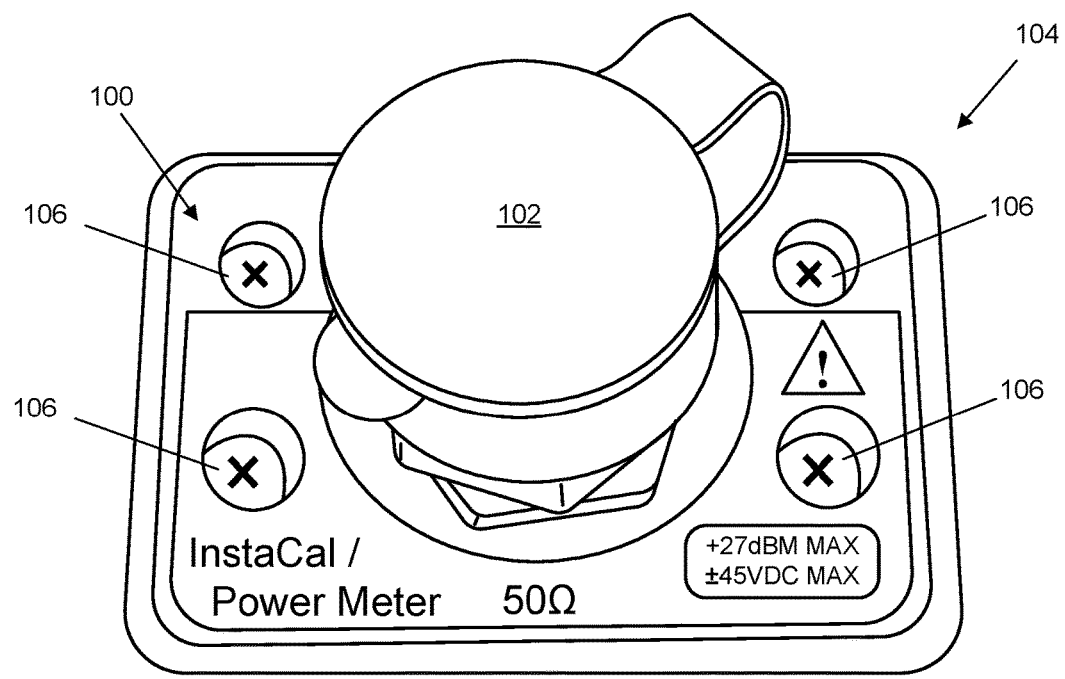
FIG. 1 shows a module which includes a calibration component and a power measurement component, in accordance with an embodiment.

FIG. 1 shows a module 100 which includes a calibration component and a power measurement component. The module 100 can provide a single port 102 (shown under a protective cover) which can be used to perform calibration and power measurements. The module 100 can be attached to one panel 104, such as a top panel, of a measurement device, such as a handheld vector network analyzer (VNA). This provides easy access to two standard tools at all times, built into the device. The module can be mounted using one or more screws 106 or similar mechanisms, which enables broken or defective modules to be quickly removed and replaced.

Figure 2:
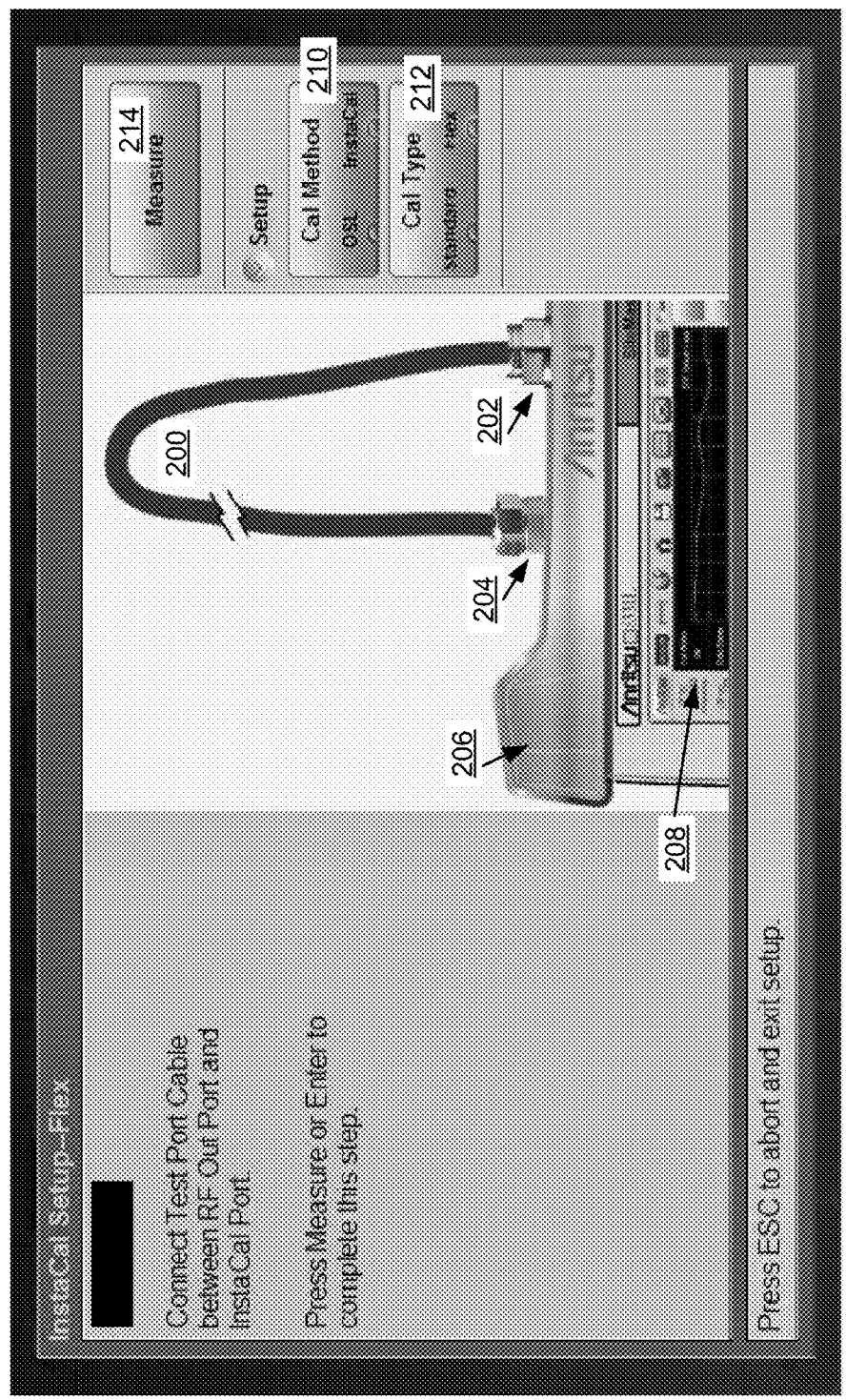
FIG. 2 shows a module which includes a calibration component and a power measurement component in use, in accordance with an embodiment.

FIG. 2 shows a module which includes a calibration component and a power measurement component in use, in accordance with an embodiment. As shown in FIG. 2, a test port cable 200 can be used to connect the calibration/power measurement module port 202 to an RF out port 204 of a measurement device 206. A graphical user interface 208 of the measurement device 206 can be used to enter a calibration mode. The user can navigate to the calibration mode using one or more hard or soft keys built into the measurement device 206, or through a touchscreen interface. Once in calibration mode, with the test port cable 200 connecting the module port 202 to the RF out port 204, the user can select settings for the calibration, such as calibration method 210 and calibration type 212. Once the calibration has been set up, the user can select measure 214, through the graphical user interface 208, to perform the calibration.

Figure 3:
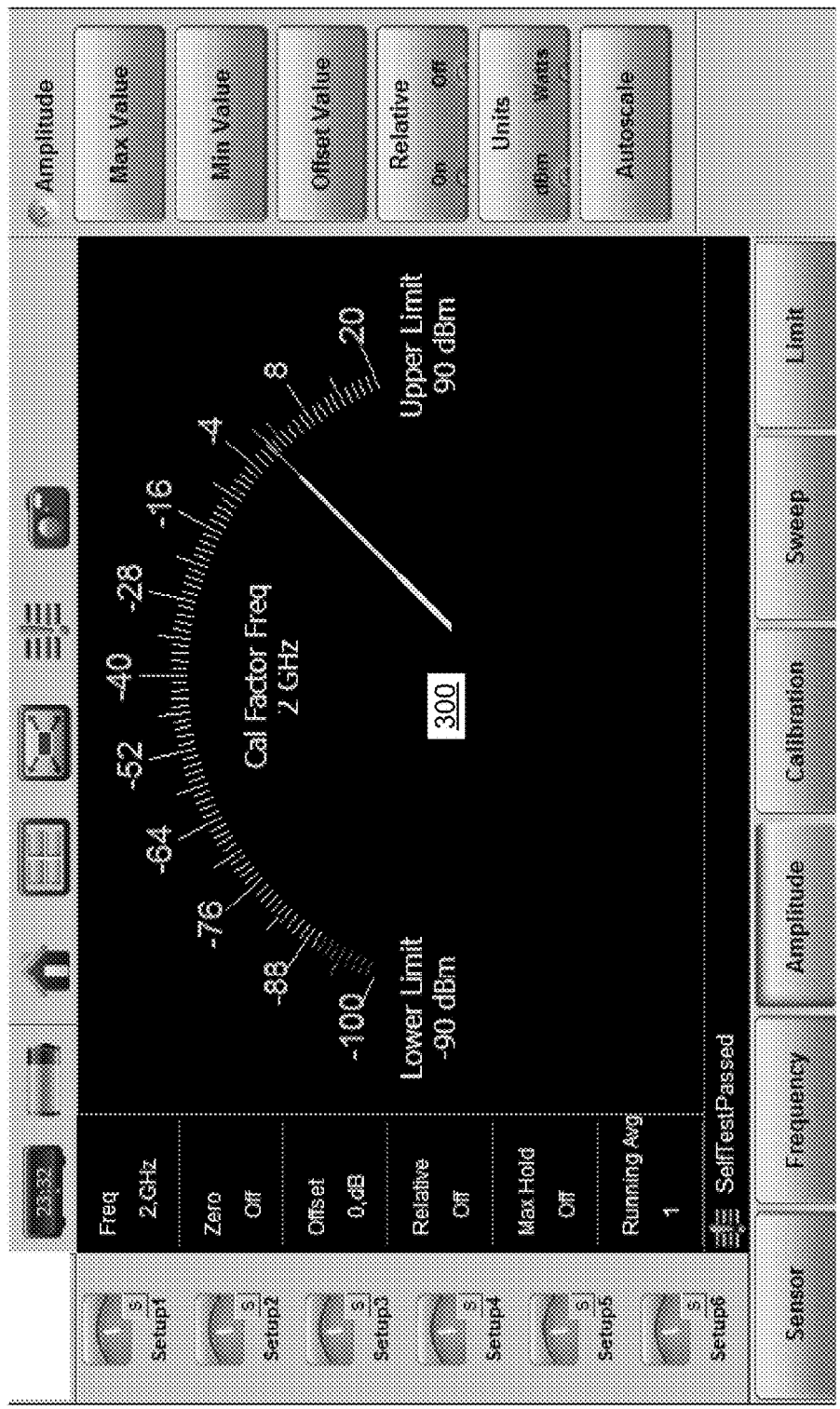
FIG. 3 shows a power meter, in accordance with an embodiment.

FIG. 3 shows a power meter 300, in accordance with an embodiment. As shown in FIG. 3, power meter 300 can be built in to the measurement device. The built-in power meter 300 can be used to display power measured through the combined calibration/power measurement module port.

Figure 4:
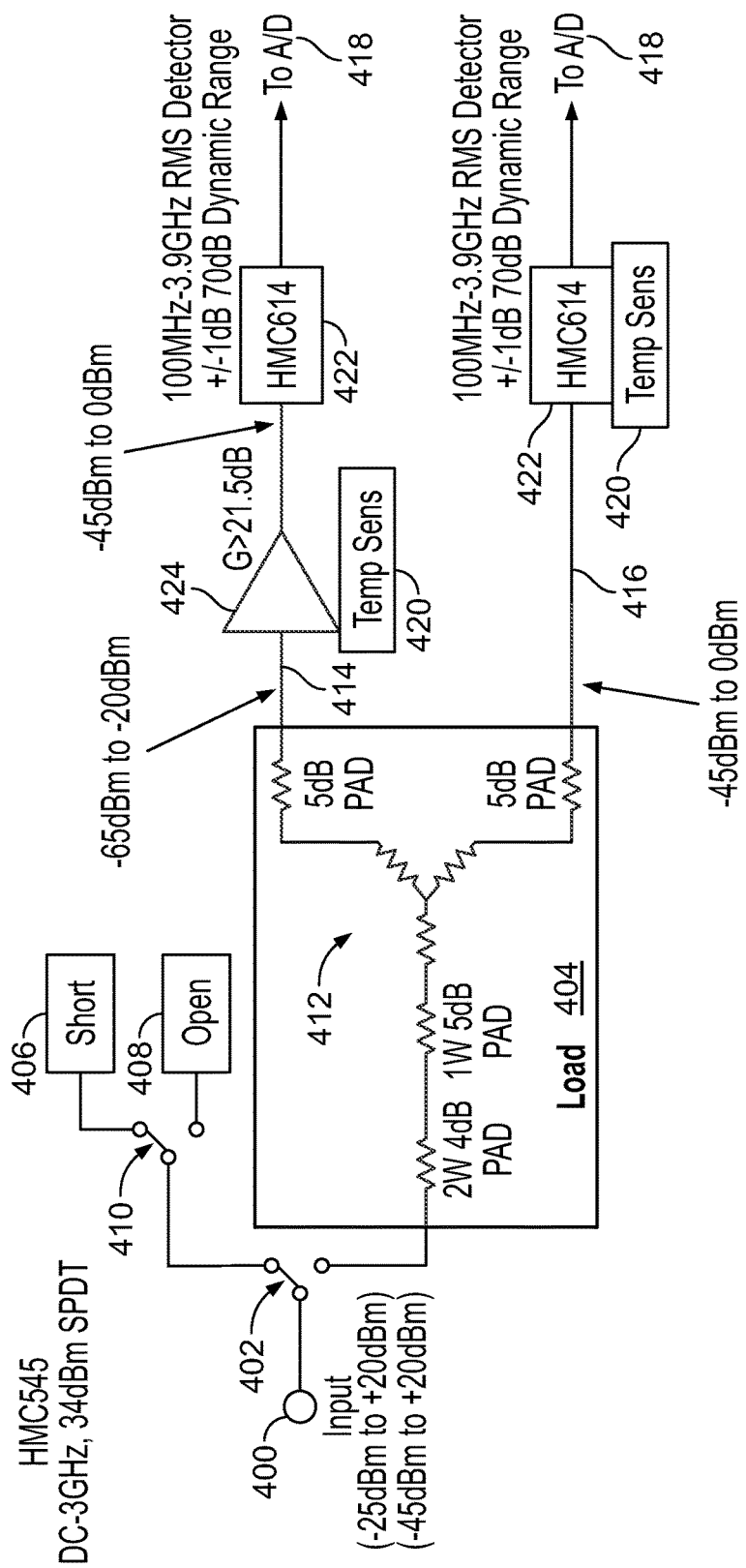
FIG. 4 shows a diagram of a module which includes a calibration component and a power measurement component, in accordance with an embodiment.

FIG. 4 shows a diagram of a module which includes a calibration component and a power measurement component, in accordance with an embodiment. As shown in FIG. 4, a signal can be received through an input 400 to the combined calibration/power measurement module. A switch 402 can be used to select between a load 404, short 406 or open 408 calibration. A second switch 410 can be used to select between the short 406 and open 408 calibration. If load 404 is selected, then in addition to calibration, a power measurement of the input signal can be performed. The input signal is passed through a resistor network 412 and then across two paths 414, 416 to an A/D converter 418. Each path 414, 416 can include a temperature sensor 420 and an RMS detector 422. The upper path 414 can also include an amplifier 424 having a gain of more than 21.5 dB.

Figure 5:
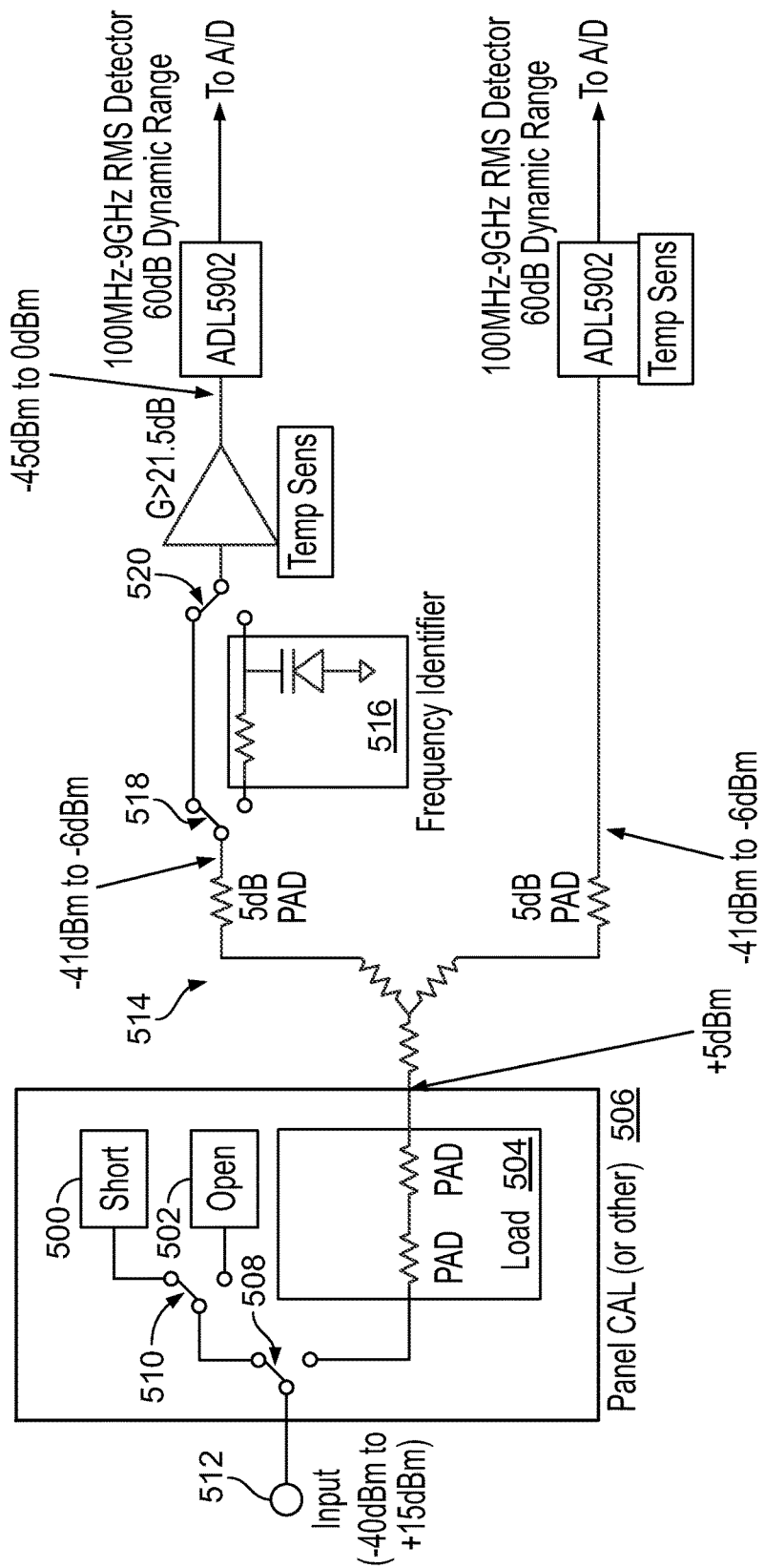
FIG. 5 shows a diagram of an alternative module which includes a calibration component and a power measurement component, in accordance with an embodiment.

FIG. 5 shows a diagram of an alternative module which includes a calibration component and a power measurement component, in accordance with an embodiment. As shown in FIG. 5, the short 500, open 502, and load 504 standards can be included in a Panel CAL 506. These standards can be used for calibration using a plurality of switches 508, 510. The power of signals received via an input 512 can be measured similarly to FIG. 4, however the upper path 514 also includes a frequency identifier 516 which can be connected to this path 514 via switches 518 and 520.

Although the present invention has been described above with particularity, this was merely to teach one of ordinary skill in the art how to make and use the invention. Many additional modifications will fall within the scope of the invention, as that scope is defined by the following claims.

What is claimed is:

1. A measurement device comprising:
    a test port; and
    a replaceable module removably mounted to a panel of the measurement device for calibrating the measurement device and measuring power, the replaceable module including
        a single module port,
        an open-short-load (OSL) component electrically connected with the single module port and switchable between an open standard, a short standard and a load,
        a first lookup table corresponding to the OSL component,
        a power measuring component connected with the load of the OSL component,
        wherein the load and the power measuring component together include a resistor network that branches into a first path having an amplifier and a second path,
        wherein the first path and the second path each include a temperature sensor and a root-mean-square (RMS) detector and are connected with an analog-to-digital converter, and
        a second lookup table corresponding to the power measuring component,
        wherein the second lookup table includes at least one of temperature, power and frequency information;
    wherein the measurement device is adapted to be calibrated and measured for power using the replaceable module by connecting a cable between the test port and the single module port.

2. The measurement device of claim 1 wherein the replaceable module includes a non-volatile memory which stores data which characterizes the OSL component and the power measuring component.

3. The measurement device of claim 1 wherein the measurement instrument is a vector network analyzer (VNA) and the replaceable module is mounted to a front panel of VNA.

4. The measurement device of claim 3 wherein the VNA is a handheld VNA.

5. A vector network analyzer (VNA), comprising:
    a screen operable to display measurement data;
    a plurality of hard and soft keys operable to receive input from a user;
    a test port;
    a replaceable module removably mounted to a panel of the VNA for calibrating the VNA, the replaceable module including
        a module port,
        an open-short-load (OSL) component electrically connected with the module port and switchable between an open standard, a short standard and a load,
        a power measuring component connected with the load of the OSL component operable to measure power of signals received by the VNA,
        wherein the load and the power measuring component together include a resistor network that branches into a first path having an amplifier and a second path,
        wherein the first path and the second path each include a temperature sensor and a root-mean-square (RMS) detector and are connected with an analog-to-digital converter, and
        a first lookup table corresponding to the OSL component and a second lookup table corresponding to the power measuring component and including at least one of temperature, power and frequency information;
    wherein the VNA is adapted to be calibrated and measured for power using the replaceable module by connecting a cable between the test port and the module port.

6. The VNA of claim 5 further comprising a non-volatile memory which stores data which characterizes the OSL component and the power measuring component.

7. The VNA of claim 5 wherein the OSL component is mounted to a front panel of the VNA.

8. The VNA of claim 5 wherein the VNA is a handheld VNA.

\* \* \* \* \*